(12) United States Patent
Rius et al.

(10) Patent No.: US 8,826,853 B2
(45) Date of Patent: Sep. 9, 2014

(54) APPARATUS FOR PECVD DEPOSITION OF AN INTERNAL BARRIER LAYER ON A RECEPTACLE, THE APPARATUS INCLUDING AN OPTICAL PLASMA ANALYSIS DEVICE

(75) Inventors: Jean-Michel Rius, Octeville-sur-Mer (FR); Guy Feuilloley, Octeville-sur-Mer (FR)

(73) Assignee: Sidel Participations, Octeville sur Mer (FR)

( * ) Notice: Subject to any disclaimer, the term of this patent is extended or adjusted under 35 U.S.C. 154(b) by 1555 days.

(21) Appl. No.: 11/995,185

(22) PCT Filed: Jul. 12, 2006

(86) PCT No.: PCT/FR2006/001703
§ 371 (c)(1),
(2), (4) Date: Jul. 16, 2008

(87) PCT Pub. No.: WO2007/006977
PCT Pub. Date: Jan. 18, 2007

(65) Prior Publication Data
US 2009/0133626 A1    May 28, 2009

(30) Foreign Application Priority Data
Jul. 13, 2005    (FR) ..................... 05 07555

(51) Int. Cl.
*C23C 16/00* (2006.01)
*B05D 7/22* (2006.01)
*H05H 1/00* (2006.01)
*H05H 1/24* (2006.01)
*C23C 16/52* (2006.01)
*C23C 16/04* (2006.01)

(52) U.S. Cl.
CPC ............... *H05H 1/24* (2013.01); *H05H 1/0025* (2013.01); *C23C 16/52* (2013.01); *C23C 16/045* (2013.01)
USPC ................... 118/723 R; 118/723 E; 118/728; 118/733; 427/230; 427/238; 156/345.27; 356/326

(58) Field of Classification Search
CPC .. C23C 16/045; C23C 15/526; H05H 1/0025; C03C 17/004; B05D 1/62; H01J 37/32963; H01J 37/32972
USPC ........... 118/723 R, 723 E, 728, 733; 427/230, 427/238; 356/326; 156/345.24
See application file for complete search history.

(56) References Cited

U.S. PATENT DOCUMENTS

| | | | |
|---|---|---|---|
| 4,407,709 A | | 10/1983 | Enjouji et al. |
| 5,521,351 A | * | 5/1996 | Mahoney ................. 219/121.59 |

(Continued)

FOREIGN PATENT DOCUMENTS

| | | |
|---|---|---|
| DE | 103 41 513 A1 | 3/2004 |
| EP | 1 068 032 A1 | 1/2001 |

(Continued)

*Primary Examiner* — Dah-Wei D Yuan
*Assistant Examiner* — Binu Thomas
(74) *Attorney, Agent, or Firm* — Sughrue Mion, PLLC

(57) ABSTRACT

An apparatus (1) for PECVD deposition of a thin layer of a barrier-effect material in a receptacle (3), the apparatus comprising: a structure (5) receiving the receptacle (3), said structure (5) defining a plasma-presence zone (18), said structure (5) being provided with an orifice (14) defining an axis (A1) and presenting an inside opening (15) opening out into the plasma-presence zone (18), and an outside opening (16) opening out outside said zone (18); an electromagnetic wave generator; and an optical plasma monitor device (19) including a pick-up (21) placed outside the plasma-presence zone (18) on the axis (A1) of said orifice.

12 Claims, 3 Drawing Sheets

(56) References Cited

U.S. PATENT DOCUMENTS

| | | | |
|---|---|---|---|
| 5,849,366 A * | 12/1998 | Plester | 427/491 |
| 6,180,191 B1 * | 1/2001 | Felts | 427/569 |
| 6,919,114 B1 | 7/2005 | Darras et al. | |
| 7,888,619 B2 * | 2/2011 | Duclos | 219/121.47 |
| 2002/0009814 A1 * | 1/2002 | Usui et al. | 438/8 |
| 2005/0118365 A1 * | 6/2005 | Miyazaki et al. | 428/34.1 |

FOREIGN PATENT DOCUMENTS

| | | | |
|---|---|---|---|
| EP | 1 500 600 A1 | | 1/2005 |
| FR | 1 541 499 A | | 10/1968 |
| JP | 61-130485 A | | 6/1986 |
| JP | 62-93382 A | | 4/1987 |
| JP | 2004-137556 A | | 5/2004 |
| WO | 99/49991 A1 | | 10/1999 |
| WO | WO/2006/000539 | * | 5/2006 |

* cited by examiner

APPARATUS FOR PECVD DEPOSITION OF AN INTERNAL BARRIER LAYER ON A RECEPTACLE, THE APPARATUS INCLUDING AN OPTICAL PLASMA ANALYSIS DEVICE

CROSS REFERENCE TO RELATED APPLICATIONS

This application is a National Stage of International Application No. PCT/FR2006/001703 filed on Jul. 12, 2006, claiming priority based on French Patent Application No. 050755, filed Jul. 13, 2005, the contents of all of which are incorporated herein by reference in their entirety.

FIELD OF THE INVENTION

The invention relates to fabricating receptacles, and more particularly receptacles made of polymer and lined, on an inside wall, with a layer comprising a barrier-effect material.

DESCRIPTION OF THE RELATED ART

Such a layer, e.g. of hydrogenated amorphous carbon of the hard type (diamond-like carbon (DLC)), or of the soft type (polymer-like carbon (PLC)) is conventionally formed by plasma-enhanced chemical vapor deposition (PECVD). That technology is well explained in European patent No. EP 1 068 032 in the name of the Applicant, or indeed in American U.S. Pat. No. 5,522,351.

It is possible to select several types of reaction that can be implemented, with everything depending on the material it is desired to deposit on the inside wall of the receptacle.

For example with a soft carbon (PLC), it is preferable to use acetylene ($C_2H_2$) as the precursor gas which is introduced into the receptacle, in which a partial vacuum has previously been established (at about 0.1 millibar (mbar)), and then the plasma is activated, i.e. the acetylene is caused to take on a cold plasma state, with activation being performed by ultra-high frequency (UHF) microwave electromagnetic excitation (at 2.45 gigahertz (GHz)) at low power. Amongst the species that are generated, there are to be found hydrogenated carbon (with CH, $CH_2$, and $CH_3$ bonds) that becomes deposited in a thin layer (having a thickness of about 1600 Angstroms (Å)) on the polymer substrate formed by the inside wall of the receptacle.

In practice, it is difficult to control the species that are generated in the plasma since its composition depends to a large extent on operating conditions (reaction time, temperature, pressure, microwave power, etc.). It has been found that species that are not desirable for a coating (e.g. oxygen or nitrogen) sometimes appear. It is then necessary to discard the spoiled receptacle. To perform quality control of receptacles, the plasma is itself monitored systemically (i.e. for each receptacle). Monitoring is generally performed optically. Thus, in above-mentioned American U.S. Pat. No. 5,522,351, a probe connected by optical fiber to a spectrometer is placed within the receptacle in order to monitor the plasma in situ. The spectrometer is supposed to detect the presence of such and such a species in the plasma, where each species is characterized by a particular spectrum line. Nevertheless, in practice, the deposit generated by the plasma interferes with measurement quality. As a result, and as stated in that patent, in the above-described context, the measurement can be performed only when deposition does not take place on the probe.

When making a carbon deposit, the use of such a setup is to be avoided: after a few iterations, the probe becomes polluted by a deposit of carbon that makes the measurements unusable.

In order to avoid pollution problems, a widespread practice consists in placing a pick-up connected to a spectrometer outside the plasma-presence zone and to observe the plasma through the receptacle and the wall of the enclosure in which the receptacle is placed (which enclosure generally comprises a cylindrical wall of quartz in which the above-mentioned partial vacuum prevails). Nevertheless, it is necessary to perform extremely thorough signal processing on the raw data picked up by the pick-up in order to obviate the interference produced by the material through which photons coming from the plasma pass, and in particular the polymer of the receptacle and the quartz of the enclosure, and to deduce from the raw data the nature of the species that are present in the plasma.

That is why the need is still felt for a setup that enables the plasma to be analyzed while avoiding the above-mentioned problems.

SUMMARY OF THE INVENTION

For this purpose, the invention provides an apparatus for plasma-enhanced chemical vapor deposition (PECVD) of a thin layer of barrier-effect material on an inside wall of a receptacle, the apparatus comprising:

a structure receiving the receptacle, said structure defining a plasma-presence zone, said structure being provided with an orifice defining an axis (the orifice itself being defined at least in part by a surface of revolution about said axis) and presenting an inside opening opening out into the plasma-presence zone, and an outside opening opening out outside said zone;

an electromagnetic wave generator for activating the plasma; and an optical plasma monitor device comprising a spectrometer and a pick-up placed outside the plasma-presence zone and connected to the spectrometer, the apparatus being characterized in that said pick-up is placed on the axis of said orifice so as to be in direct optical contact with the plasma-presence zone.

In an embodiment, said orifice is defined by a tube. It may be a tubular injector passing through the neck of the receptacle to introduce a precursor gas therein, and having an inside opening opening out into the receptacle, or it may be a fitted tube having an inside opening that opens out into a post-discharge zone outside the receptacle.

In another embodiment, said orifice is formed in a confinement grid of a plasma post-discharge zone, outside the receptacle.

Under such circumstances, the apparatus includes, for example, a system for pumping out the gas derived from the plasma out through said grid.

BRIEF DESCRIPTION OF THE DRAWINGS

Other objects and advantages of the invention appear in the light of the following description with reference to the accompanying drawings, in which.

DETAILED DESCRIPTION OF THE INVENTION

Figure 1:
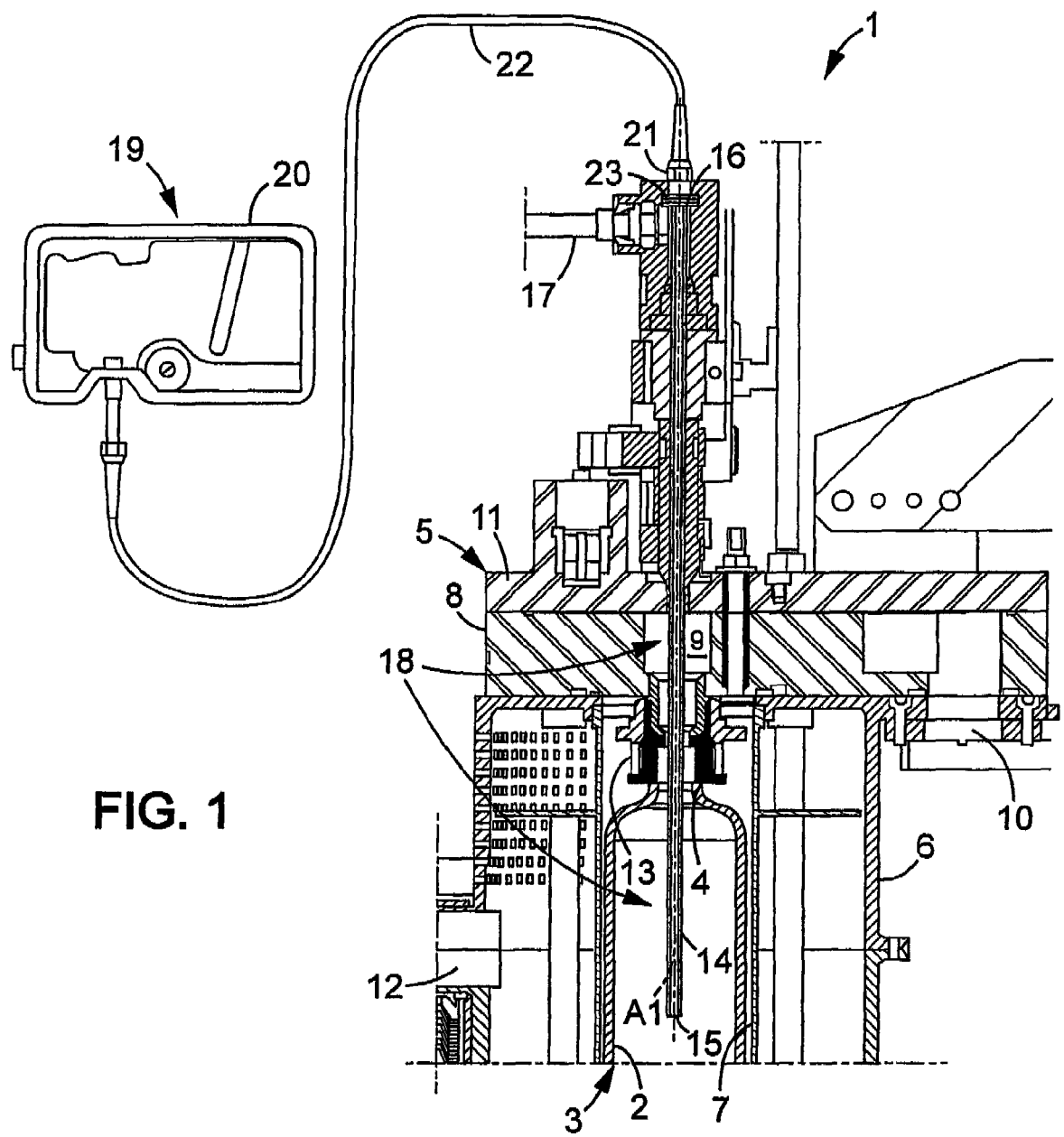
FIG. 1 is an elevation view in section showing an apparatus constituting a first embodiment of the present invention.

The figures show an apparatus 1 for plasma-enhanced chemical vapor deposition (PECVD) of a thin layer of a barrier-effect material on an inside wall 2 of a receptacle 3 having a neck 4, e.g. defining a rim. Before the PECVD operations, the receptacle 3 is formed by blowing or by stretch-blowing, for example; specifically, it is made of a polymer material such as polyethyleneterephthalate (PET).

The apparatus 1 comprises a structure 5 for receiving the receptacle 3. The structure 5 includes a substantially cylindrical cavity 6 having conductive walls, e.g. metal walls, containing an enclosure 7 defined by a cylindrical wall made of a material that is transparent to electromagnetic microwaves, e.g. of quartz, with the receptacle 3 for treatment being placed inside said enclosure.

The structure 5 also comprises a yoke 8 with openings, overlying the cavity 6 and defining above the enclosure 7 a post-discharge zone 9 connected to an exhaust 10.

The structure 5 further comprises a cover 11 overlying the yoke 8 and closing the post-discharge zone 9 remote from the enclosure 7.

The apparatus 1 further comprises an electromagnetic microwave generator connected to the cavity 6 by a waveguide 12 shown in part in the figures.

The receptacle 3 is suspended from its neck 4 in the enclosure 7 by means of a support block 13 provided with gaskets providing sealing between the receptacle 3 and the yoke 8.

The apparatus 1 is fitted with a vacuum pump (not shown) connected firstly to the inside of the enclosure 7 and secondly to the inside of the receptacle 3 via the post-discharge zone 9.

The apparatus 1 also comprises a tubular injector 14 that extends vertically through the cover 11 and the yoke 8, passing via the post-discharge zone 9 to terminate in the receptacle 3. The injector 14 presents a bottom inside end defining an inside opening 15 that opens out into the receptacle 3, and a top outside end remote therefrom defining an outside opening 16 that opens out outside the structure 5. The injector 14 presents an axis A1 that is the axis of revolution of the inside surface defining the central passage of the injector 14, and this axis A1 coincides with a general vertical axis of symmetry of the receptacle 3 when received in the enclosure 7.

The injector 14, secured to the cover 11 through which it passes, is thus integrated in the structure 5 as shown in FIG. 1, and it is connected close to its top end (outside opening 16) to an inlet 17 for precursor gas, such as acetylene.

The treatment of the receptacle 3 for forming an internal barrier layer takes place as follows. Once the receptacle 3 is in place in the enclosure 7, a partial vacuum (about 0.1 mbar) is initially established both in the receptacle 3 and in the enclosure 7 so as to maintain pressure equilibrium on either side of the wall of the receptacle 3.

Thereafter, the inside of the receptacle 3 is swept via the injector 14 with the precursor gas. Thereafter a UHF electromagnetic microwave flux is generated at 2.5 GHz and at low power (a few hundreds of watts), thereby activating a cold plasma in the injected precursor gas (giving rise to a small rise in temperature, less than the glass transition temperature of the polymer from which the receptacle 3 is made).

The plasma invades a zone 18 referred to as the plasma-presence zone, including the inside volume of the receptacle 3 and the post-discharge zone 9 defined by the yoke 8. The microwave flux is maintained for a duration of a few seconds (e.g. about 3 seconds), during which the species formed in the plasma becomes deposited on the inside wall 2 of the receptacle 3 to form a thin layer of hydrogenated amorphous carbon of the PLC type. Thereafter the microwave flux is stopped, and the gas coming from the plasma is sucked out to the exhaust 10.

Throughout the process, the plasma is analyzed in order to verify that it is uniform and to detect which species are being generated, so as to be able, where necessary, to take the measures that are required (such as ejecting the receptacle 3) when one or more undesirable species (e.g. oxygen or nitrogen) is/are to be found amongst the species present.

For this purpose, the apparatus 1 includes an optical plasma monitor device 19 that comprises a spectrometer 20 together with a pick-up 21 placed outside the plasma-presence zone 18 and connected to the spectrometer 20, e.g. via an optical fiber 22.

In a first embodiment, shown in FIG. 1, the pick-up 21 is placed at the top end of the injector 14, facing the outside opening 16 on the axis A1 of the injector, so as to be in direct optical contact with the inside of the receptacle 3.

More precisely, between the pick-up 21 and the outside opening 16, at the top end of the injector 14, there is interposed a leaktight viewing port 23 made of a material having a wide passband (i.e. transmitting a large fraction or even all of the light spectrum), e.g. made of ultraviolet (UV) silica.

Given the flow direction of the precursor gas in the injector 14 towards the receptacle 3, the viewing port 23 is not subjected to any pollution by the species generated. In other words, no carbon deposit is formed on the viewing port 23. However, photons generated by the plasma travel back up the injector 14 (having an inside diameter lying in the range about 4 millimeters (mm) to 5 mm) to reach the pick-up 21 through the viewing port 23: this setup thus enables the plasma to be observed optically, the spectrometer 20 then enabling it to be analyzed.

Figure 2:
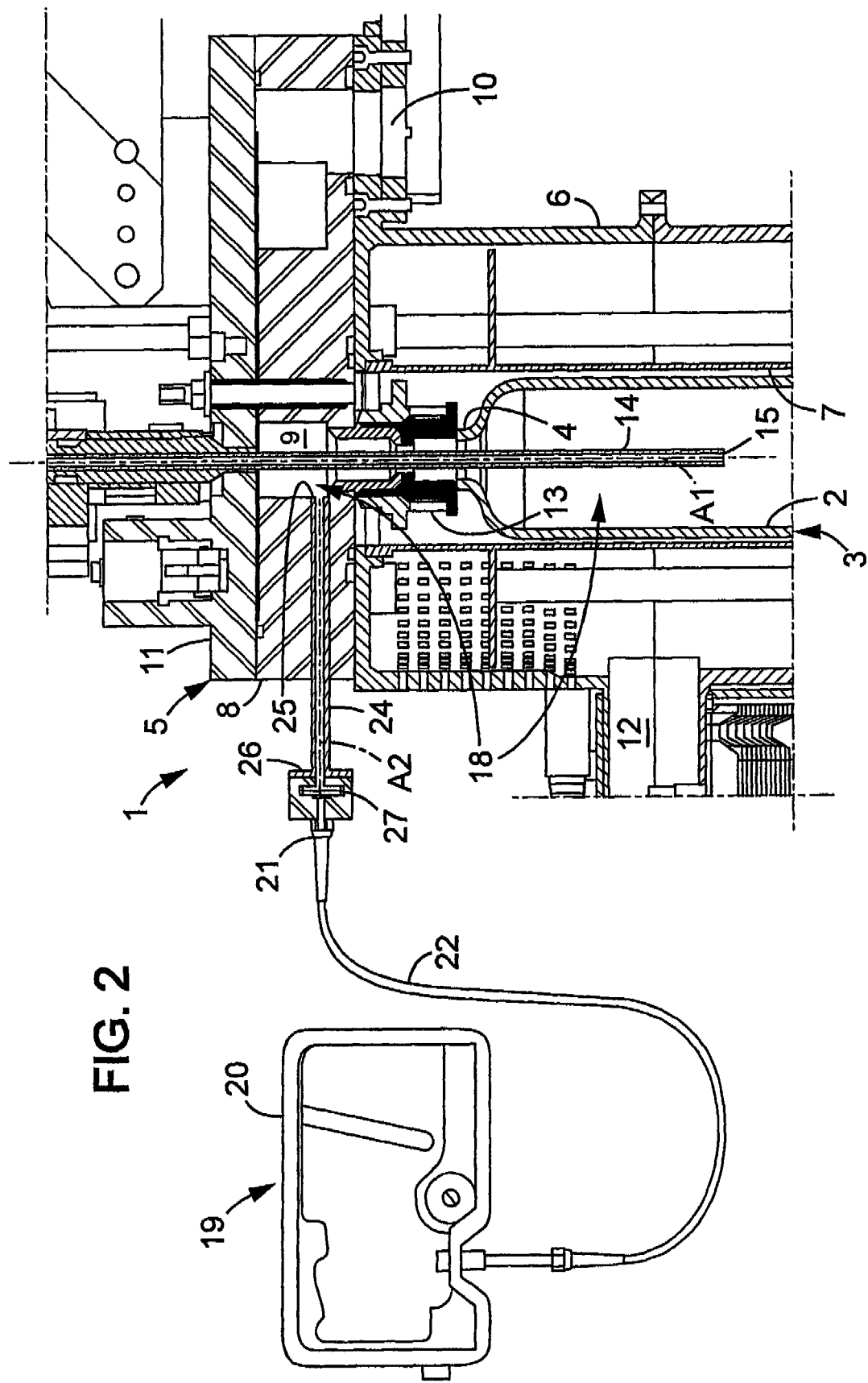
FIG. 2 is an elevation view in section showing an apparatus constituting a second embodiment of the present invention.

In a second embodiment, shown in FIG. 2, the apparatus 1 has a tube 24 fitted to and passing through the yoke 8. The tube 24 as integrated in this way in the structure defines an axis A2 (axis of revolution of the inside surface of the tube 24) that is substantially perpendicular to the axis A1, and it presents a first end defining an internal opening 25 that opens out into the post-discharge zone 9 at its side remote from the exhaust 10, and an opposite second end that defines an external opening 26 opening to the outside of the structure 5.

As can be seen in FIG. 2, the pick-up 21 is mounted close to the external opening 26 at the second end of the tube 24 on the axis A2 thereof, so as to be in direct optical contact with the post-discharge zone 9, which zone is invaded by the plasma when the plasma is activated. As in the first embodiment, a viewing port 27 having a wide passband is interposed between the pick-up 21 and the outside opening 26 of the tube 24.

As a result, as in the above-described first embodiment, the plasma is observed directly with optical analysis thereof being performed by means of the spectrometer 20.

The deposition of species on the viewing port 27 is limited, firstly because the diameter of the tube 24 is small compared with the sectional dimensions of the post-discharge zone 9 and of the exhaust 10 (in the embodiment shown, the inside diameter of the tube 24 lies in the range about 4 mm to about 5 mm), and secondly because once the microwave flux has been stopped, pumping out the gas derived from the plasma sets up a fluid flow that is directed from the inside of the receptacle 3 and the post-discharge zone 9 towards the exhaust 10, i.e. away from the tube 24.

Figure 3:
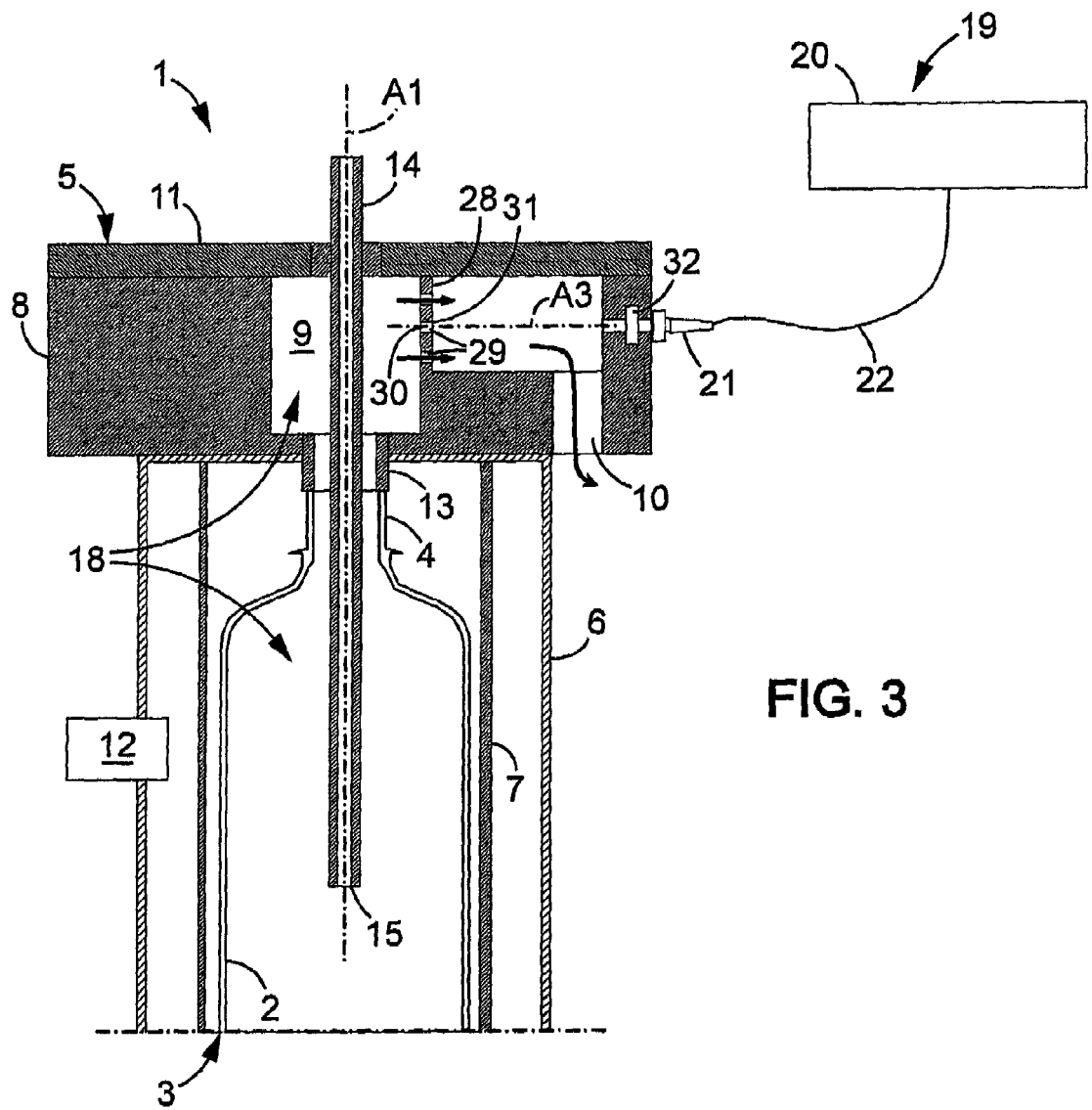
FIG. 3 is a diagrammatic elevation view in section showing an apparatus constituting a third embodiment of the present invention.

In a third embodiment, shown in FIG. 3, the post-discharge zone 9 is bordered by a grid 28 that confines the plasma in said zone 9 while putting the zone into communication with the exhaust 10. The grid 28 presents a plurality of holes 29 through which the gas coming from the plasma passes under the effect of a fluid flow (represented by arrows in FIG. 3) generated by a system (not shown) for pumping out the gas.

By way of example, the grid 28 is disposed substantially parallel to the axis A1 of the receptacle 3. Each of its holes 29 presents an inside opening 30 opening out into the post-discharge zone 9, and an opposite, outside opening 31 (opening out towards the exhaust 10). Each hole 29 defines an axis A3 (axis of revolution of the surface defining the hole 29) that is locally perpendicular to the grid (and thus substantially perpendicular to the axis of the receptacle).

As shown in FIG. 3, the pick-up 21 is integrated in the yoke 8 on the axis A3 of one of the holes 29 so as to be in direct optical contact with the post-discharge zone 9, possibly with a viewing port 32 being interposed as in the first two embodiments. Since the grid 28 has a plasma-confinement function, the viewing port 32 is not reached by the plasma, such that no species deposit can form thereon, which would otherwise be liable to interfere with the measurements.

Thus, whichever embodiment is selected from the three described above, the apparatus 1 is provided with an orifice (in the first embodiment, this orifice is constituted by the tubular injector 14, in the second by the fitted tube 24, and in the third by one of the holes 29 in the confinement grid 28), through which the plasma is observed by means of the pick-up 21 looking along the axis A1, A2, or A3 of the orifice towards the plasma-presence zone 18, with analysis thereof being performed by means of the spectrometer 20.

Such a disposition makes it possible to analyze the plasma while avoiding (or limiting) any risk of a deposit of species derived from the plasma falsifying the measurements taken via the pick-up 21. The pertinence of the plasma analysis is thus increased, thereby benefiting in particular the quality of the treated receptacles.

The invention claimed is:

1. An apparatus for plasma-enhanced chemical vapour deposition (PECVD) of a thin layer of barrier-effect material on an inside wall of a receptacle, said apparatus comprising:
   a structure that receives the receptacle, comprising at least a yoke and a cover overlying said yoke, said structure defining a plasma-presence zone including:
     an inside volume of the receptacle and
     a plasma post-discharge zone outside said receptacle defined by the yoke and closed by the cover,
   said structure being provided with an orifice defining an axis and presenting an inside opening, opening out into said plasma-presence zone, and an outside opening, opening out outside said plasma-presence zone;
   an electromagnetic wave generator for activating a plasma; and
   an optical plasma monitor device comprising:
     a spectrometer and
     a pick-up placed outside said plasma-presence zone and connected to said spectrometer; wherein said pick-up is placed on said axis of said orifice so as to be in direct optical contact with said plasma-presence zone,
     wherein said orifice is formed in a confinement grid of a plasma post-discharge zone, outside said receptacle, and
     wherein said grid presenting a plurality of holes defining each an axis, the pick-up is integrated in the yoke on the axis of one of the plurality of holes.

2. The apparatus according to claim 1, wherein said orifice is a tube, said receptacle is provided with a neck, said tube is a tubular injector passing said neck to introduce a precursor gas into the receptacle, said injector presenting an outside opening, opening outside the structure; and wherein the pick-up is placed facing the outside opening.

3. The apparatus according to claim 1, further comprising a system for pumping out gas derived from the plasma out through said grid.

4. The apparatus according to claim 1, wherein said orifice is a tube having an inside diameter of about 4 mm to 5 mm.

5. The apparatus according to claim 1, further comprising an exhaust through which gas from the plasma is pumped out of the structure and wherein the post-discharge zone is bordered by a grid comprising a plurality of openings that confine the plasma to the post-discharge zone while allowing gas from the plasma to pass through the grid and toward the exhaust.

6. The apparatus according to claim 1, wherein the pick-up is placed entirely outside said plasma-presence zone.

7. An apparatus for plasma-enhanced chemical vapour deposition (PECVD) of a thin layer of barrier-effect material on an inside wall of a receptacle, said apparatus comprising:
   a structure that receives the receptacle, comprising at least a yoke and a cover overlying said yoke, said structure defining a plasma-presence zone including:
     an inside volume of the receptacle and
     a plasma post-discharge zone outside said receptacle defined by the yoke and closed by the cover,
   said structure being provided with an orifice defining an axis and presenting an inside opening, opening out into said plasma-presence zone, and an outside opening, opening out outside said plasma-presence zone;
   an electromagnetic wave generator for activating a plasma; and
   an optical plasma monitor device comprising:
     a spectrometer and
     a pick-up placed outside said plasma-presence zone and connected to said spectrometer;
   wherein said pick-up is placed on said axis of said orifice so as to be in direct optical contact with said plasma-presence zone,
   and wherein said orifice is a tube and said pick-up is positioned over said tube and aligned with the longitudinal axis of the tube so as to be in direct optical contact with the inside of the tube.

8. The apparatus according to claim 7, wherein said tube is a tubular injector configured to introduce a precursor gas into the receptacle.

9. The apparatus according to claim 8, wherein said injector has an outside opening that opens outside of the structure and arranged so that the precursor gas in the tube flows in a direction away from the outside opening, said pick-up positioned over an end of the injector having the outside opening.

10. The apparatus according to claim 7, further comprising an exhaust through which gas from the plasma is pumped out of the structure; and wherein said tube has an outside opening that opens outside of the structure and arranged so that the gas that is pumped out of the structure towards the exhaust and travels in a direction away from the tube.

11. The apparatus according to claim 7, wherein said orifice is defined by a tube fitted to and passing through the yoke.

12. The apparatus according to claim 11, wherein the tube presents a first end defining an internal opening that opens out into the post-discharge zone, and an opposite second end defining an external opening that opens to the outside of the structure, and wherein the pick-up is mounted on the axis and close to the external opening at the second end of the tube.

* * * * *